Aug. 12, 1958 J. I. PANKOVE 2,847,336
PROCESSING SEMICONDUCTOR DEVICES
Filed Jan. 30, 1956
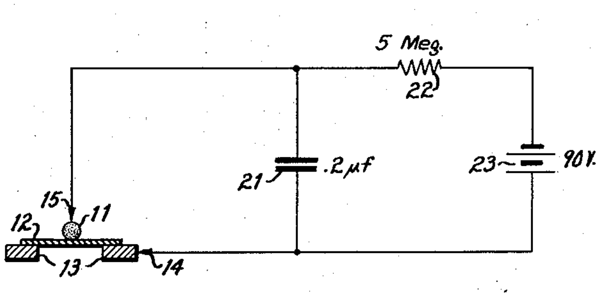
INVENTOR.
JACQUES I. PANKOVE
BY J. C. Whittaker
ATTORNEY 2,847,336

PROCESSING SEMICONDUCTOR DEVICES

Jacques I. Pankove, Princeton, N. J., assignor to Radio Corporation of America, a corporation of Delaware Application January 30, 1956, Serial No. 562,053

7 Claims. (Cl. 148—1.5)

This invention relates in general to an improved method of making P–N junction semiconductor devices and to the improved product of the method. More particularly, the invention relates to an improved method of making devices including P–N rectifying barrier layers by alloying an impurity substance into a body of crystalline semiconductive material, and to the resulting product.

It is known in the art to make semiconductor devices by the surface alloy process. The method consists of preparing a small body of purified single crystal semiconductive material, usually germanium or silicon, of one conductivity type. Next a pellet of impurity material is placed on a surface of the semiconductor body and suitably heated to alloy the impurity into the semiconductor. The impurity is chosen from those materials which will impart the opposite type of conductivity to the semiconductor. Hence this method results in the formation of a P–N rectifying barrier within the body of the semiconductor wafer. If the semiconductor body is of the P-type, then N-forming impurity materials such as phosphorus, arsenic, antimony, or bismuth may be used. If the semiconductor body is of the N-type, then P-forming impurity materials such as aluminum, gallium, or indium may be used.

The process just described is subject to certain difficulties. During the heating cycle the impurity pellet tends to wander from the precise spot on the semiconductor wafer on which it was placed. More important, the impurity pellet when molten tends to spread considerably over the surface of the semiconductor body. This difficulty increases with the increased use of purer crystal semiconductors having fewer edge dislocations per unit volume. The spreading of the impurity pellet produces unsatisfactory devices for three reasons: first, the excessive spread of the impurity material may cause a short circuit to the base tab; second, the excessive spreading of the impurity material causes excessive collector capacitance; third, the variable size of the junctions causes variable electrical characteristics when reproducibility is wanted.

There have been many attempts to solve this problem. For example, one method is to confine the impurity pellet within a ceramic or metal ring or washer placed on a surface of a semiconductor wafer, and then restraining the whole assembly in a jig. The assembly is then heated in a furnace while still positioned by the jig, so that the impurity pellet is alloyed into the semiconductor wafer at the desired location. However, when the impurity pellet melts, it has a tendency to tunnel beneath the surface of the confining ring, spreading out over the surface of the semiconductor wafer, producing the undesirable effects described above.

One object of the present invention is to provide an improved method of making semiconductor devices having at least one P–N junction.

Another object of the invention is to provide an improved method of introducing P–N rectifying barriers into a body of crystalline semi-conductive material such as germanium or silicon.

Another object of the invention is to provide an improved method of making alloy type P–N junction devices.

Another object of the invention is to provide improved alloy type P–N junction devices that will have uniform electrical characteristics.

The foregoing and other objects and advantages may be accomplished in accordance with the invention by the introduction, before the alloying step, of crystal imperfections at the site where it is desired to place a P–N junction electrode by alloying or diffusion techniques. Such imperfections may be produced, for example, by (1) mechanically disturbing the crystal lattice structure, as by scratching the surface of the crystal or (2) by sending a pulse of current through the crystal at the site of the junction.

The invention will be described in greater detail by reference to the accompanying drawing, the single figure of which illustrates one embodiment of the method of making P–N junction devices in accordance with the present invention.

It is known that optimum electrical characteristics are obtained with crystals having a minimum of edge dislocations.

Edge dislocations are imperfections in the structure of a crystal. The imperfections are small regions where the regular pattern of the crystal breaks down and some atoms are not properly surrounded by neighbors. The type of imperfection in which one plane of atoms slips partly over another plane, and the slip vector is at right angles to the dislocation, is known as an edge dislocation. See Chapters 1 and 2 of "Dislocations in Crystals," by W. T. Read, McGraw-Hill Book Company, Inc., New York, 1953. Germanium normally used for making semiconductor devices has from 1,000 to 10,000 edge dislocations per cm.$^2$. Purified germanium now produced has as low as 100 to 800 edge dislocations per cm.$^2$. Excessive and erratic spreading of the impurity dot occurs during the heating cycle when semiconductive material with low edge dislocation density (100 to 800 per cm.$^2$) is used.

It was unexpectedly found that the presence of edge dislocations inhibits the lateral spread of indium pellets on germanium wafers during the alloying process. However, the use of germanium or silicon with a high edge dislocation density throughout the crystal for the purpose of reducing the lateral spreading effect is not the most desirable solution, because it tends to introduce unsatisfactory electrical characteristics, such as raising the collector saturation current. The present invention provides for the introduction of a localized disturbance of the crystal structure at the precise site on the semiconductor wafer where the P–N junction is desired. As illustrative embodiments of methods of carrying out the invention, two methods of introducing localized crystal disturbances will be described. The two methods are mechanical and electrical respectively.

The first method is to mechanically disturb the crystal structure of the semiconductor wafer at the desired spot. This may be accomplished by scratching with a hard pointed tool, such as a diamond or sapphire, or by otherwise abrading, bruising, crushing, cutting, digging, etching, filing, furrowing, grating, grinding, probing, scraping, abrasive blasting or wearing the surface of the crystalline semiconductor wafer at the required site. For example, a diamond point tool is pressed against a surface of the semiconductor wafer at the desired site until a visible indentation is made. One such indentation is sufficient. The diameter of the indentation is smaller than the diameter of the pellet in this example.

The N-forming or P-forming impurity pellet is thereafter placed on the crystal semiconductor wafer at the point where the surface of the pellet was abraded or scratched. The assembly is then placed in a furnace as usual and heat treated to alloy the impurity material into the semiconductor wafer. For example, if a pellet of indium is used as the P-forming impurity material on a wafer of N-type germanium, the assembly is heated in a reducing atmosphere for 0.5 to 5 minutes at a temperature of 400 to 550° C. A restraining jig may be used for holding the assembly in place, but is not necessary for the process. The impurity pellet will melt at the desired site without excessive spreading, and on cooling will form a P–N junction there.

The second method of this invention is to electrically disturb the crystal structure of the semiconductor wafer at the desired site by sending an electrical pulse of high current density through it. One embodiment of this second method is shown in Figure 1. A pellet of impurity material 11, for example indium, is placed on the surface of a crystalline semiconductor wafer 12, for example germanium, the wafer 12 having been mounted by an ohmic connection on the base tab 13, which may be made of nickel. The impurity pellet 11 may be positioned by a ring or washer (not shown) of ceramic or other insulating material. Two point contacts 14 and 15 are connected across a condenser 21 of 0.2 microfarad capacity. The condenser is charged through a 5 megohm resistor 22 by a 90 volt direct current source 23. For this example, the polarity is not material because the pulse produced has a voltage higher than the break-down voltage. If current is passed thru in a forward direction, then it is not necessary to exceed the break-down voltage. The polarity is not material but the voltage used must be higher than the break-down voltage if polarity is disregarded. Any suitable switching means may be employed for automatic mass production. In the particular circuit shown, no switch is actually required. Merely touching the impurity pellet 11 by one contact 15 and the base tab 13 by the other contact 14 will cause the condenser to discharge a suitable electrical pulse which will adhere the impurity pellet 11 to the desired site on the semiconductor wafer 12. At the same time the electrical pulse also forms at the desired site imperfections in the structure of the crystalline semiconductor wafer 12. The assembly of impurity pellet, semiconductor wafer, and base tab is then placed in a furnace and heat treated to alloy the impurity material into the semiconductor pellet. No restraining jig is required. The impurity pellet will melt at the desired site without excessive spreading, and on cooling will form a P–N junction there.

This method may be modified as follows when it is desired to make a series of devices. The point contact 14 is replaced by a metal plate (not shown) on which each device is positioned so that the base tab 13 rests directly on the metal plate. The point contact 15 is then used to lightly spear an indium pellet. The pellet is next touched to the desired site on the germanium wafer 12. This closes the circuit, and a pulse of current will flow thru pellet and wafer that will cause the pellet to adhere to the wafer at the desired site. The contact 15 may then be pulled away and used to lightly spear another indium pellet, for use on the dext device, or on another surface of the same device. The assembly of pellet, wafer, and base tab is then heated as above.

It will be obvious to those skilled in the art that the simple circuit shown and the associated electrical parameters are only by way of illustration. It will also be readily apparent that although this invention has been described in terms of a pellet of elements such as boron, aluminum, gallium, indium, arsenic, antimony, bismuth, there may be used instead any desired alloy that will introduce a region of opposite conductivity to that of the crystalline semiconductive wafer.

There have thus been described improved methods of making crystalline semiconductive devices with improved rectifying barriers, which produce P–N junction devices with more uniform electrical characteristics.

What is claimed is:

1. In the method of making a P–N junction semiconductor device including alloying a quantity of conductivity determining impurity material having low edge dislocation density to a body of crystalline semiconductor material, said impurity material having a lower melting point than said semiconductor body, the step of disturbing the crystal structure of the semiconductor body at the desired electrode site and then alloying said quantity of impurity material into the semiconductor body by heating to a temperature above the melting point of said impurity but below the melting point of said semiconductor body.

2. The method as in claim 1, in which the lattice structure of the crystal semiconductor is disturbed at the desired electrode site by mechanical deformation.

3. The method as in claim 1, in which the lattice structure of the crystal semiconductor is disturbed at the desired electrode site by passing an electrical pulse therethrough.

4. The method as in claim 3, in which the electrical pulse of high current density is passed through the impurity material to the crystalline semiconductor, thereby fusing the impurity material to the semiconductor at the precise location desired.

5. In a method of making a P–N junction semiconductor device by a process including alloying a quantity of impurity material to a body of crystalline semiconductor material having low edge dislocation density, said impurity material having a lower melting point than said semiconductor, the step comprising disturbing the lattice structure of said crystal semiconductor at the desired electrode site prior to said alloying, to inhibit spreading of said impurity material.

6. The method as in claim 5, in which the crystal semiconductor is germanium.

7. The method as in claim 5, in which the crystal semiconductor is silicon.

References Cited in the file of this patent

UNITED STATES PATENTS

| | | |
|---|---|---|
| 2,654,059 | Shockley | Sept. 29, 1953 |
| 2,705,767 | Hall | Apr. 5, 1955 |
| 2,742,383 | Barnes et al. | Apr. 17, 1956 |

FOREIGN PATENTS

| | | |
|---|---|---|
| 1,038,658 | France | May 13, 1953 |

UNITED STATES PATENT OFFICE

CERTIFICATE OF CORRECTION

Patent No. 2,847,336 August 12, 1958

Jacques I. Pankove

It is hereby certified that error appears in the printed specification of the above numbered patent requiring correction and that the said Letters Patent should read as corrected below.

Column 4, lines 20 and 21, strike out "having low edge dislocation density"; line 22, after "material", first occurrence, insert -- having low edge dislocation density --.

Signed and sealed this 4th day of November 1958.

(SEAL)
Attest:

KARL H. AXLINE
Attesting Officer

ROBERT C. WATSON
Commissioner of Patents